(12) United States Patent
Kronholz et al.

(10) Patent No.: US 8,765,559 B2
(45) Date of Patent: Jul. 1, 2014

(54) SOPHISTICATED GATE ELECTRODE STRUCTURES FORMED BY CAP LAYER REMOVAL WITH REDUCED LOSS OF EMBEDDED STRAIN-INDUCING SEMICONDUCTOR MATERIAL

(75) Inventors: Stephan Kronholz, Dresden (DE); Gunda Beernink, Dresden (DE); Markus Lenski, Dresden (DE); Frank Seliger, Dresden (DE); Frank Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 92 days.

(21) Appl. No.: 13/358,101

(22) Filed: Jan. 25, 2012

(65) Prior Publication Data

US 2012/0196417 A1 Aug. 2, 2012

(30) Foreign Application Priority Data

Jan. 31, 2011 (DE) .......................... 10 2011 003 385

(51) Int. Cl.
*H01L 21/336* (2006.01)

(52) U.S. Cl.
USPC .................. 438/300; 438/276; 257/E21.626; 257/E21.635

(58) Field of Classification Search
CPC ..... H01L 21/324; H01L 29/10; H01L 29/165; H01L 21/823828
USPC ........... 438/300, 276; 257/E21.621, E21.626, 257/E21.635
See application file for complete search history.

(56) References Cited

U.S. PATENT DOCUMENTS

| | | | |
|---|---|---|---|
| 2010/0059833 A1* | 3/2010 | Yu et al. ........................ | 257/410 |
| 2010/0072523 A1 | 3/2010 | Sato et al. ..................... | 257/289 |
| 2010/0216287 A1* | 8/2010 | Tsai et al. ..................... | 438/199 |
| 2010/0330808 A1 | 12/2010 | Richter et al. ................ | 438/691 |
| 2011/0129980 A1 | 6/2011 | Heinrich et al. .............. | 438/305 |
| 2012/0190162 A1* | 7/2012 | Miyashita et al. ............ | 438/299 |

FOREIGN PATENT DOCUMENTS

| | | | | |
|---|---|---|---|---|
| DE | 102009031146 A1 | 1/2011 | ............ | H01L 21/336 |
| DE | 102009047309 A1 | 6/2011 | ............ | H01L 21/283 |

OTHER PUBLICATIONS

Translation of Official Communication from German Patent Office for German Patent Application No. 10 2011 003 385.8 dated Oct. 11, 2011.

* cited by examiner

*Primary Examiner* — Caridad Everhart
(74) *Attorney, Agent, or Firm* — Amerson Law Firm, PLLC

(57) ABSTRACT

When forming sophisticated gate electrode structures, such as high-k metal gate electrode structures, an appropriate encapsulation may be achieved, while also undue material loss of a strain-inducing semiconductor material that is provided in one type of transistor may be avoided. To this end, the patterning of the protective spacer structure prior to depositing the strain-inducing semiconductor material may be achieved for each type of transistor on the basis of the same process flow, while, after the deposition of the strain-inducing semiconductor material, an etch stop layer may be provided so as to preserve integrity of the active regions.

20 Claims, 8 Drawing Sheets

SOPHISTICATED GATE ELECTRODE STRUCTURES FORMED BY CAP LAYER REMOVAL WITH REDUCED LOSS OF EMBEDDED STRAIN-INDUCING SEMICONDUCTOR MATERIAL

BACKGROUND OF THE INVENTION

1. Field of the Invention

Generally, the present disclosure relates to the fabrication of highly sophisticated integrated circuits including transistor elements that comprise a strain-inducing embedded semiconductor material.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles, in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Thus, relatively high leakage currents are caused by the direct tunneling of charge carriers through an ultra-thin silicon dioxide gate insulation layer and may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence since, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein, in the typical electrode material, polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required.

In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and in particular the sensitive high-k dielectric materials, in combination with any metal-containing cap layers, have to be reliably confined by appropriate materials throughout the entire processing of the semiconductor device.

Further concepts for enhancing performance of transistors have been developed by providing a plurality of strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor. Other efficient strain-inducing mechanisms are well established in which a highly stressed dielectric material may be positioned in close proximity to the transistor, thereby also inducing a certain type of strain in the channel region.

Although the approach of providing a sophisticated high-k metal gate electrode structure in an early manufacturing stage in combination with additional strain-inducing mechanisms may have the potential of providing extremely powerful semiconductor devices, such as CPUs, storage devices, systems on a chip (SOC) and the like, conventional approaches may still suffer from process non-uniformities, as will be described with reference to FIGS. 1a-1e.

FIG. 1a schematically illustrates a cross-sectional view of a semiconductor device 100 comprising a substrate 101, such as a silicon substrate, in combination with a semiconductor layer 102, such as a silicon layer or a semiconductor material which contains a significant amount of silicon. In the manufacturing stage shown, the semiconductor device 100 comprises transistors 150A, 150B formed in and above respective active regions 102A and 102B. An active region is to be understood as a semiconductor region in the layer 102 in which PN junctions for one or more transistors are to be formed. An isolation structure 102C, such as a trench isolation, is provided in the semiconductor layer 102 and may be formed so as to be adjacent to the active region 102A, wherein it should be appreciated that the isolation structure 102C may also be provided laterally between the active regions 102A, 102B, thereby electrically isolating these regions, at least in the horizontal direction. Furthermore, a plurality of gate electrode structures 160A, 160B and 160C are formed above the semiconductor layer 102. In FIG. 1a, the gate electrode structures 160A, 160B are illustrated at a cross-section in which the gate electrode structures 160A, 160B are formed on the active regions 102A and 102B, respectively, wherein it should be appreciated that these gate electrode structures typically extend beyond the corresponding active region and thus these gate electrode structures may also be formed above the isolation region 102C. For example, the gate electrode structure 160C may represent a corresponding portion of a gate electrode structure that may extend into an active region along the direction perpendicular to the drawing plane of FIG. 1a. In other cases, the gate electrode structure 160C may represent a portion of the gate electrode structure 160A. In other words, in this case, the gate electrode structure 160C may represent a "continuation" of the gate electrode structure 160A in a direction perpendicular to the drawing plane of FIG. 1a. At any rate, the gate electrode structure 160C may be formed above a portion of the isolation structure 102C, which is in close proximity to the active region 102A.

As previously discussed, the gate electrode structures may comprise a gate insulation layer 161 formed on the active regions 102A, 102B, respectively, and the gate insulation layer 161 may comprise a high-k dielectric material, such as hafnium oxide-based materials and the like. It is to be noted that frequently the gate insulation layer 161 may additionally comprise a conventional dielectric material, such as a silicon oxide-based material, however, with a significantly reduced thickness of approximately 0.8 nm and less. Furthermore, a metal-containing material is typically formed on the gate insulation layer 161 when comprising the high-k dielectric material, wherein the corresponding metal-containing material may be provided with different material composition for transistors of different conductivity type in order to adjust an appropriate work function for the corresponding gate electrode structure. For example, a conductive cap layer 162A is provided in the gate electrode structures 160A, 160C, which may correspond to the same conductivity type of a transistor. Thus, the cap layer 162A typically has incorporated therein a work function metal species for the transistor 150A, while a conductive cap layer 162B includes an appropriate work function metal species for the transistor 150B. Furthermore, the gate electrode structures may comprise a further electrode material 163, such as silicon, silicon/germanium and the like, followed by a dielectric cap layer or layer system which, however, may have a different thickness for the gate electrode structures 160A, 160C on the one hand, and the gate electrode structure 160B on the other hand, due to a different exposure to reactive process atmospheres applied during the previous processing. Thus, the dielectric cap layers 164A of the structures 160C, 160A may have a thickness of, for instance, 20-40 nm, while the thickness of the cap layer 164B may be greater by approximately 15-25 nm.

Furthermore, a sidewall spacer structure 165, for instance comprising a liner material 165A in combination with a spacer element 165B, may be provided so as to protect the sidewalls of the electrode material 163, and in particular of the sensitive materials 162A, 162B and 161. The liner 165A and the spacer element 165B are typically comprised of silicon nitride. As illustrated, the materials of the components 165A, 165B may be provided in the form of a non-patterned layer system above the active region 102B and the gate electrode structure 160B so as to act as an efficient mask material during a process sequence for forming a strain-inducing semiconductor material 151, such as a silicon/germanium material, in the active region 102A. As discussed above, in sophisticated applications, performance of P-channel transistors may be significantly increased upon incorporating a strain-inducing silicon/germanium alloy into the active region of the P-channel transistor, since in this case a significant compressive strain may be induced in a channel region 152. It should be appreciated that, if required, a threshold adjusting semiconductor material, indicated as 152A, may be provided in the channel region 152, if required for appropriately adjusting the overall threshold voltage of the transistor 150A.

The semiconductor device 100 as illustrated in FIG. 1a may be formed on the basis of the following process strategies. After forming the isolation region 102C and thus laterally delineating the active regions 102A, 102B and any other active regions, the material layer 152A, if required, may be formed selectively in the active region 102A. Next, appropriate materials for the gate insulation layer 161 and the layers 162A, 162B may be formed by appropriate deposition techniques and patterning sequences, possibly in combination with any thermal treatments in order to diffuse a work function metal species into the gate dielectric layers 161, if considered appropriate. In other cases, a desired work function metal species may be deposited in the form of a continuous material layer, which may then be patterned so as to form a desired material layer above the corresponding active regions. Thereafter, the electrode material 163, for instance in the form of amorphous or polycrystalline silicon, is deposited by using well-established deposition techniques followed by the deposition of the dielectric cap layer or layer system 164A, 164B. If required, any additional materials, such as anti-reflecting coating (ARC) materials and the like, may be provided, if required, and a sophisticated lithography process sequence and anisotropic etch processes are applied in order to obtain the gate electrode structures 160A, 160B, 160C according to the design rules. For example, a length of the gate electrode structures, i.e., the horizontal extension of the electrode materials 162A, 162B, may be 50 nm and less. Next, the material layers 165S are deposited, for instance by thermally activated chemical vapor deposition (CVD), plasma enhanced CVD, low pressure CVD, multi-layer deposition techniques in order to obtain the desired material characteristics. For example, silicon nitride may be deposited so as to form a dense liner, followed by the deposition of a further silicon nitride material for the spacer elements 165B. As discussed above, when adjusting the work function and thus the basic threshold voltage of the transistors 150A, 150B upon patterning the gate electrode structures 160A, 160B, a reliable confinement of the layers 161 and 162A, 162B has to be guaranteed during the further processing since any exposure to the active process atmospheres, such as oxygen-containing chemicals and the like, may result in a significant shift of the previously adjusted transistor characteristics.

Thereafter, an etch mask (not shown) is formed so as to cover the transistor 150B while exposing the active region 102A and the portion of the isolation region 102C having formed thereon the gate electrode structure 160C. As discussed above, the gate electrode structures 160A, 160C may represent one and the same gate electrode structure or structures that are provided in close proximity and correspond to an area of P-type transistors. During the corresponding anisotropic etch processes, well-established plasma-based recipes are applied so as to etch through the previously deposited layers 165S, thereby forming the spacer structure 165 on the gate electrode structures 160C, 160A. Moreover, the etch process may be continued so as to etch into the active region 102A, possibly on the basis of a changed etch chemistry in order to form cavities therein, which are subsequently filled with the material 151. Consequently, during the cavity etch process, also the cap layers 164A are exposed to the reactive etch ambient and may thus suffer from a pronounced material erosion, which may result in the reduced thickness of these layers compared to the dielectric cap layer 164B, which may still be covered by the spacer layers 165S and corresponding resist mask.

Next, the device 100 is prepared for the selective deposition of the strain-inducing semiconductor material 151, which typically involves a plurality of cleaning recipes, which may result in a significant erosion of oxide-based materials, such as the insulating material in the isolation region 102C. Thus, a pronounced degree of recessing, indicated as 107C, is generated in the isolation region 102C, thereby also causing a certain degree of under-etching of the spacer structure 165 of the gate electrode structure 160C. Thereafter, the material 151 is selectively grown in the corresponding cavities by applying a selective epitaxial growth process based on well-established process recipes. Typically, the process parameters are selected such that a significant degree of material deposition may occur on more or less pure silicon surface areas, while dielectric surface areas, such as silicon nitride, silicon dioxide and the like, may substantially not receive the material 151.

FIG. 1b schematically illustrates the semiconductor device 100 in a manufacturing stage in which an etch mask 103 covers the active region 102A and a portion of the isolation region 102C comprising the gate electrode structure 160C, while the gate electrode structure 160B and the active region 102B are exposed to a reactive etch ambient 104. During the etch process 104, the spacer structure 165 is formed on sidewalls of the gate electrode structure 160B. Thus, during the process 104, the dielectric cap layer 164B may be exposed, wherein, however, a significantly reduced degree of material erosion may occur so that still a significant difference in thickness between the layer 164B and the layers 164A is preserved. After the etch process 104, the etch mask 103 may be removed and thus the gate electrode structures 160A, 160C may have a similar configuration, i.e., these structures comprise the sidewall spacer structure 165, which may be used as an offset spacer structure for controlling a subsequent implantation sequence for introducing a dopant species in order to form drain and source extension regions and halo regions, i.e., counter-doped regions, as required for obtaining the complex dopant profile for adjusting the overall transistor characteristics. On the other hand, due to the previous difference in the overall process flow, the cap layers 164A and 164B may differ significantly from each other with respect to their thickness in this manufacturing stage. During the further processing, the dielectric cap layers 164A, 164B have to be removed which, however, may influence the configuration of the spacer structure 165 if comprised of a similar material. For instance, plasma-based etch recipes or wet chemical etch recipes may be applied which, however, may have a pronounced lateral etch rate, thereby causing a significant degree of material erosion in the spacer structure 165. For this reason, the spacer structure 165 is protected by a sacrificial oxide spacer element having a high etch resistivity with respect to an efficient nitride etch chemistry.

FIG. 1c schematically illustrates the semiconductor device 100 with an oxide spacer layer 166, which is etched during an etch process 105 in order to form sacrificial oxide spacers 166S on the sidewall spacer structure 165. During the etch process 105, also a significant material erosion may occur in the isolation structure 102C since a certain over-etch time is required in order to reliably expose the dielectric cap layers 164A, 164B. Consequently, the recess 107C in the isolation region 102C may be significantly increased and also a certain degree of recessing 107A, 107B is generated in the active regions 102A, 102B, respectively. Consequently, also a certain amount of the strain-inducing material 151 is removed during the etch process 105.

FIG. 1d schematically illustrates the device 100 when exposed to a further etch process 106 for removing the dielectric cap layers 164A, 164B on the basis of an appropriate etch chemistry, such as hot phosphoric acid and the like. It should be appreciated that the pronounced recess 107C in the isolation region 102C may result in a certain probability of under-etching the gate electrode structure 160C and attacking the sensitive materials, which may be highly disadvantageous in any areas close to the active region 102A, for example when the gate electrode structure 160C is the continuation of the gate electrode structure 160A along the direction perpendicular to the drawing plane of FIG. 1e, or in other cases when the gate electrode structure 160C is formed laterally adjacent to the active region 102A, as shown in FIG. 1e, however, with a very reduced offset, as may be required in some sophisticated device designs.

FIG. 1e schematically illustrates the semiconductor device 100 in a further advanced manufacturing stage. As illustrated, the sacrificial sidewall spacers 166S (FIG. 1d) are removed, which may be accomplished on the basis of diluted hydrofluoric acid (HF) which, however, also removes a certain portion of the isolation structure 102C, thereby even further increasing the recess 107C.

As a consequence, in addition to the pronounced degree of recessing in the isolation region 102C, also a significant amount of material has been removed from the initially deposited strain-inducing semiconductor material 151 so that the resulting strain-inducing effect significantly depends on the previous process history. As discussed above, in particular in combination with the sophisticated gate electrode structures 160A, 160B, 160C comprising a channel semiconductor material, such as the material 152A (FIG. 1a), the resulting strain conditions may be even more complex since the material 152A is directly formed within the channel region and may have a different effect on the overall strain conditions in the channel region. In particular, when the overall device dimensions and thus the gate length of the transistors are reduced, for instance, to 40 nm and less, the degree of recessing in the active regions 102A, 102B may remain substantially the same, while generally the reduced dimensions may result in an over-proportional effect of any process fluctuations on the resulting strain conditions. On the other hand, a reduced and varying efficiency of the strain-inducing mechanism may significantly contribute to a variation of important transistor characteristics, such as threshold voltage and the like. Hence, in particular the loss of the strain-inducing semiconductor material caused in the previously described sophisticated process strategy may increasingly contribute to transistor variations when further reducing the overall transistor dimensions.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which superior transistor performance and enhanced uniformity of transistor characteristics may be accomplished by significantly reducing the material loss of a strain-inducing semiconductor material and also for superior uniformity of the overall process flow, for instance with respect to recessing active regions of transistors, which may not receive an embedded strain-inducing semiconductor material. To this end, the encapsulation of the gate electrode structures may be formed in a highly symmetric manner with respect to the gate electrode structures of any type of transistor, thereby significantly improving the overall process uniformity. Additionally, the embedded strain-inducing semiconductor material may be covered by an appropriate hard mask material after the deposition and prior to any material-consuming reactive processes, such as the removal of dielectric cap layers of the gate electrode structures. In this manner, the further processing may be continued on the basis of superior uniformity and predictability of the strain conditions, generally the electronic characteristics of the various types of transistors.

One illustrative method disclosed herein relates to forming a semiconductor device. The method comprises forming a first gate electrode structure above a first active region and a second gate electrode structure above a second active region, wherein the first and second gate electrode structures comprise a dielectric cap layer. The method additionally comprises forming a protective spacer commonly on sidewalls of the first and second gate electrode structures. Moreover, a strain-inducing semiconductor material is formed in the first active region in the presence of the first gate electrode structure, while the second active region and the second gate electrode structures are covered. Furthermore, the method comprises forming an etch stop layer above the first and second active regions after forming the strain-inducing semiconductor material. Moreover, a fill material is formed above the first and second active regions so as to laterally enclose the first and second gate electrode structures and to expose the dielectric cap layers. Thereafter, the dielectric cap layers are removed. Moreover, drain and source regions are formed in the first and second active regions.

A further illustrative method disclosed herein relates to forming a semiconductor device. The method comprises forming a strain-inducing semiconductor alloy in a first active region in the presence of a first gate electrode structure of a first transistor, while a second gate electrode structure and a second active region of a second transistor are masked. Moreover, each of the first and second gate electrode structures comprises a dielectric cap layer. The method further comprises forming an etch stop layer above the first and second gate electrode structures and the first and second active regions. Moreover, a material layer is formed above the etch stop layer and the dielectric cap layers are removed in the presence of at least a portion of the material layer.

A still further illustrative method disclosed herein comprises forming a first gate electrode structure above a first active region of a first transistor, wherein the first gate electrode structure comprises a first high-k dielectric material and a first dielectric cap layer. The method further comprises forming a second gate electrode structure above a second active region of a second transistor, wherein the first and second transistors are of inverse conductivity type and wherein the second gate electrode structure comprises a second high-k dielectric material and a second dielectric cap layer. Moreover, a first spacer structure is formed on sidewalls of the first and second gate electrode structures. The method further comprises masking the second active region and the second gate electrode structure by a silicon dioxide-based material layer after forming the first spacer structure. Moreover, a cavity is formed in the first active region by using the silicon dioxide-based material as an etch mask. The method further comprises forming a strain-inducing semiconductor material in the cavity by using the silicon dioxide-based material layer as a deposition mask. Additionally, the method comprises forming a sacrificial cap layer on the strain-inducing semiconductor material prior to removing the first and second dielectric cap layers.

BRIEF DESCRIPTION OF THE DRAWINGS

The disclosure may be understood by reference to the following description taken in conjunction with the accompanying drawings, in which like reference numerals identify like elements, and in which.

Figure 1A:
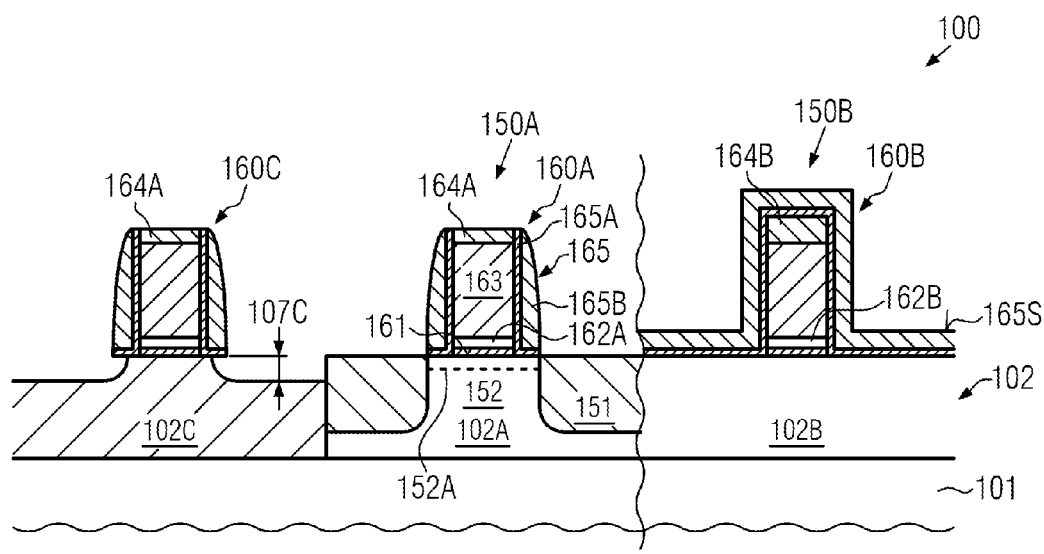
FIGS. 1a-1e schematically illustrate cross-sectional views of a semiconductor device during various manufacturing stages in providing a sophisticated high-k metal gate electrode structure in combination with a strain-inducing material on the basis of a conventional strategy, in which integrity of the gate electrode structure is preserved on the basis of a sidewall spacer structure and a sacrificial oxide spacer.
Figure 1B:
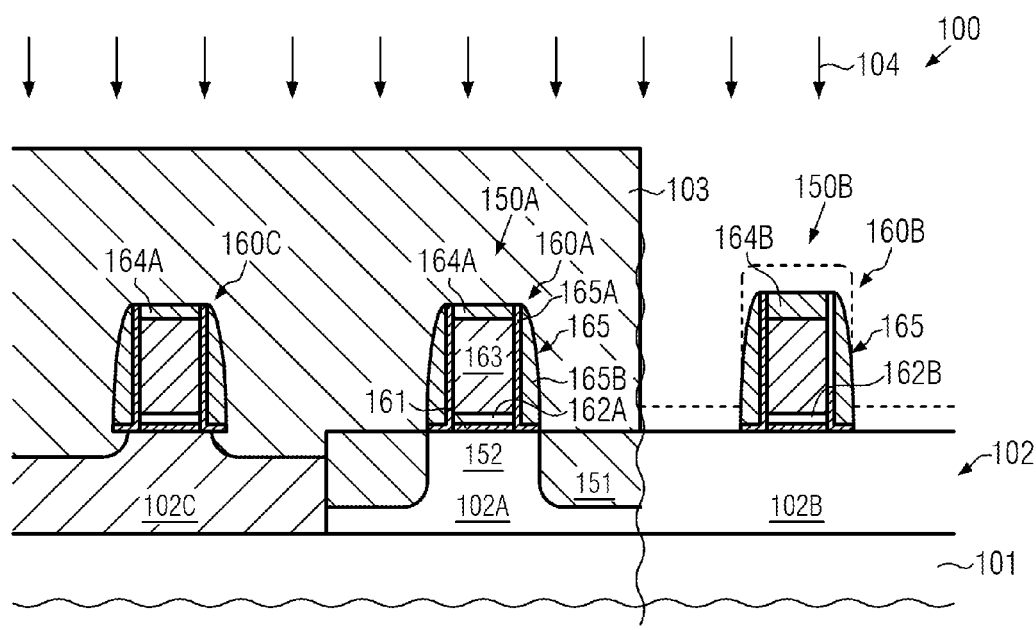
Figure 1C:
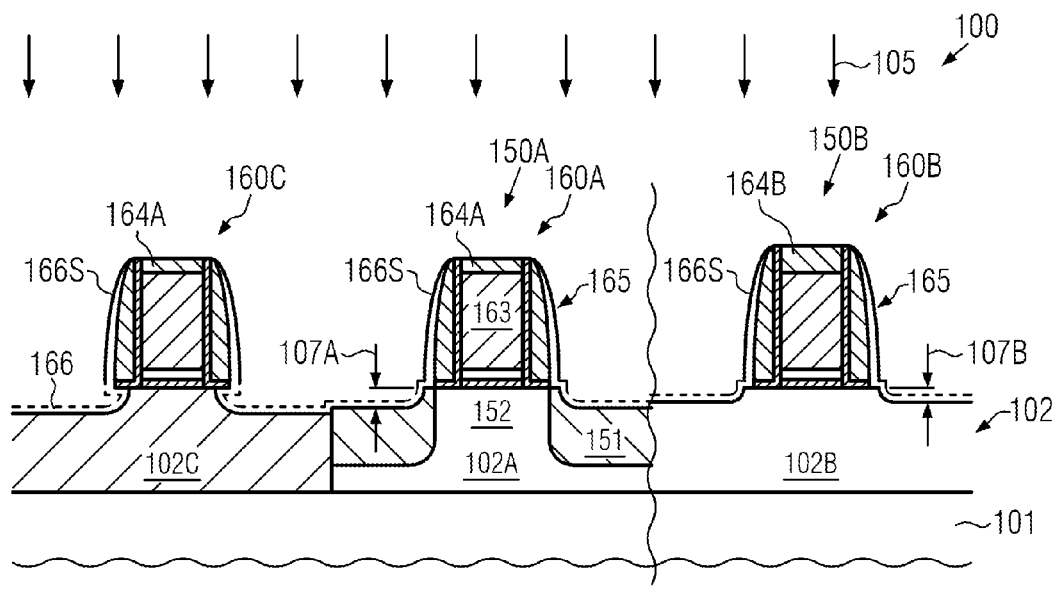
Figure 1D:
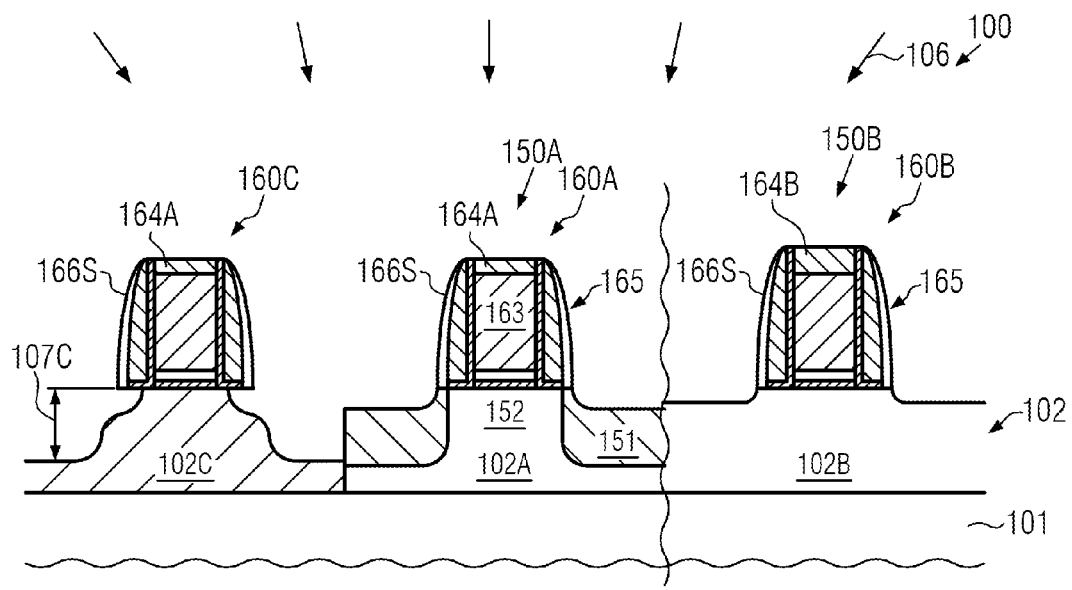
Figure 1E:
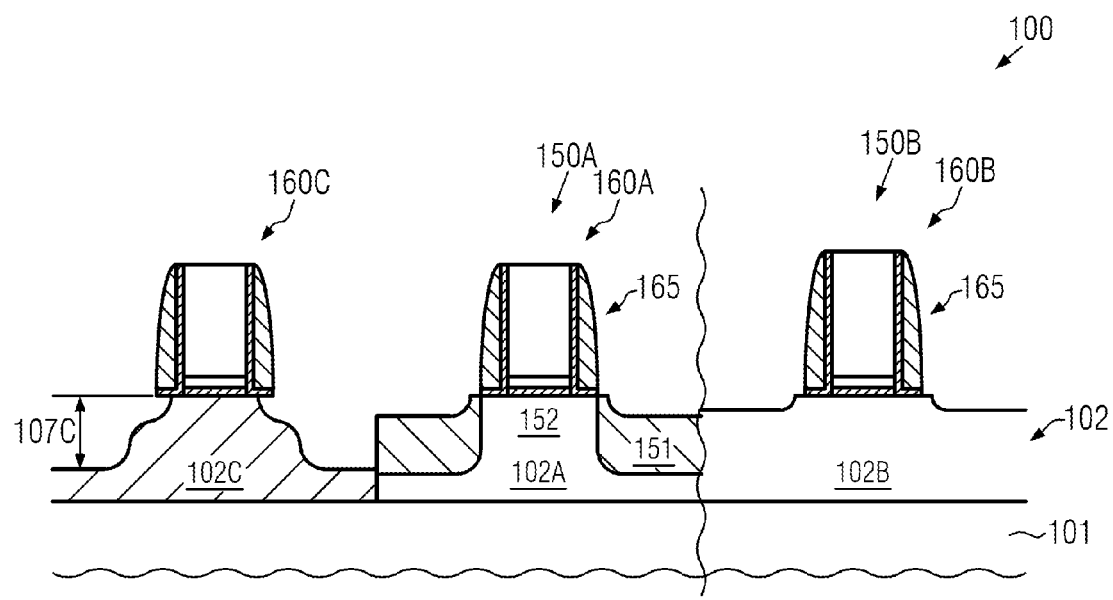

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure contemplates manufacturing techniques in which sophisticated gate electrode structures, such as gate electrode structures having a gate length of 40 nm and less and, in some illustrative embodiments, comprising a high-k dielectric material and a metal-containing electrode material provided in an early manufacturing stage, may be formed together with a strain-inducing semiconductor material that is provided selectively in one type of transistor. To this end, the material loss of the embedded strain-inducing semiconductor material may be reduced by providing a corresponding cap layer or etch stop layer after the selective deposition of the strain-inducing semiconductor alloy and prior to performing any reactive processes, which may conventionally result in a significant degree of material removal, which may conventionally add up to a high degree of process variations, which in turn may directly translate into significant transistor variability, in particular when the transistors are provided with the high-k metal gate electrode structures. Furthermore, generally the difference in material loss between active regions of transistors having implemented therein the embedded strain-inducing material and transistors having an active region without a strain-inducing semiconductor material may be reduced by applying an appropriate patterning regime for a spacer structure that may be used for preserving integrity of sensitive gate materials, such as high-k dielectrics and metal-containing electrode materials provided in an early manufacturing stage.

With reference to FIGS. 2a-2j, further illustrative embodiments will now be described in more detail, wherein reference may also be made to FIGS. 1a-1e, if required.

Figure 2A:
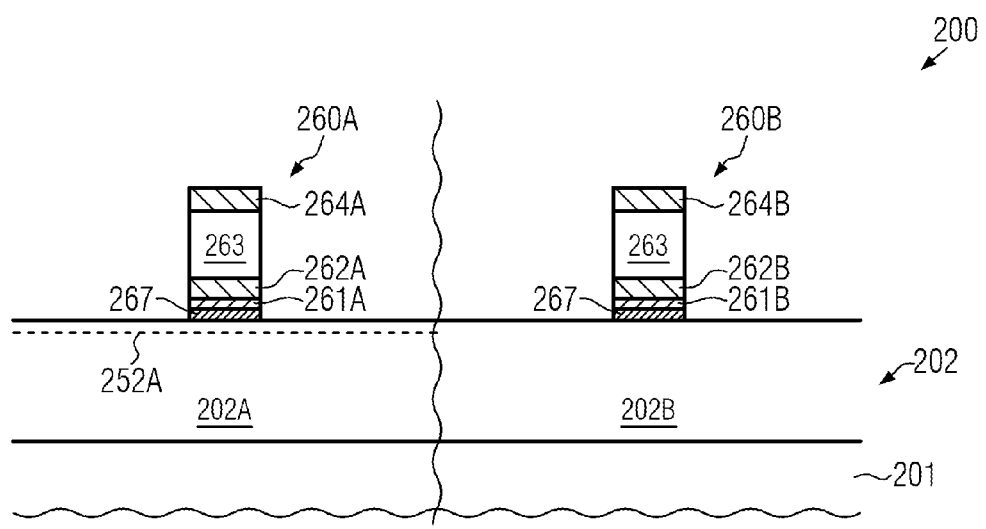
FIGS. 2a-2j schematically illustrate cross-sectional views of a semiconductor device during various manufacturing stages in forming sophisticated metal gate electrode structures, such as electrode structures comprising a high-k dielectric material, in an early manufacturing stage, while reducing the degree of material loss of a strain-inducing semiconductor material and providing superior process uniformity, according to illustrative embodiments.

FIG. 2a schematically illustrates a cross-sectional view of a semiconductor device 200 comprising a substrate 201 and a semiconductor layer 202. A plurality of active regions 202A, 202B may be provided in the layer 202 and may be laterally delineated by any isolation regions (not shown) in accordance with the overall layout of the device 200. Furthermore, a first gate electrode structure 260A may be formed above the active region 202A and a second gate electrode structure 260B may be formed on the active region 202B. The gate electrode structure 260A may comprise a gate dielectric material which, in the embodiment shown in FIG. 2a, may comprise a high-k dielectric material 261A in combination with a metal-containing electrode material 262A, while in some cases a conventional dielectric material 267 may be provided below the high-k dielectric material 261A. Furthermore, an electrode material 263 and a dielectric cap layer or cap layer system 264A may be provided. Similarly, the gate electrode structure 260B may comprise a high-k dielectric material 261B in combination with a metal-containing electrode material 262B, followed by the electrode material 263 and a dielectric cap layer 264B. Also in this case, a conventional dielectric material, such as a silicon oxynitride material 267, may be provided below the high-k dielectric material 261B. Moreover, the active region 202A may comprise a dedicated channel semiconductor material 252A, such as a silicon/germanium material, in order to appropriately adjust the band energy levels for the gate electrode structure 260A and the active region 202A in order to obtain a desired threshold voltage of a transistor still to be formed.

Furthermore, for the components described so far, also the same criteria may apply as previously discussed with reference to the semiconductor device 100. In particular, similar process techniques may be applied for forming the gate electrode structures 260A, 260B, as described above, wherein a gate length may be 40 nm and less in sophisticated applications.

Figure 2B:
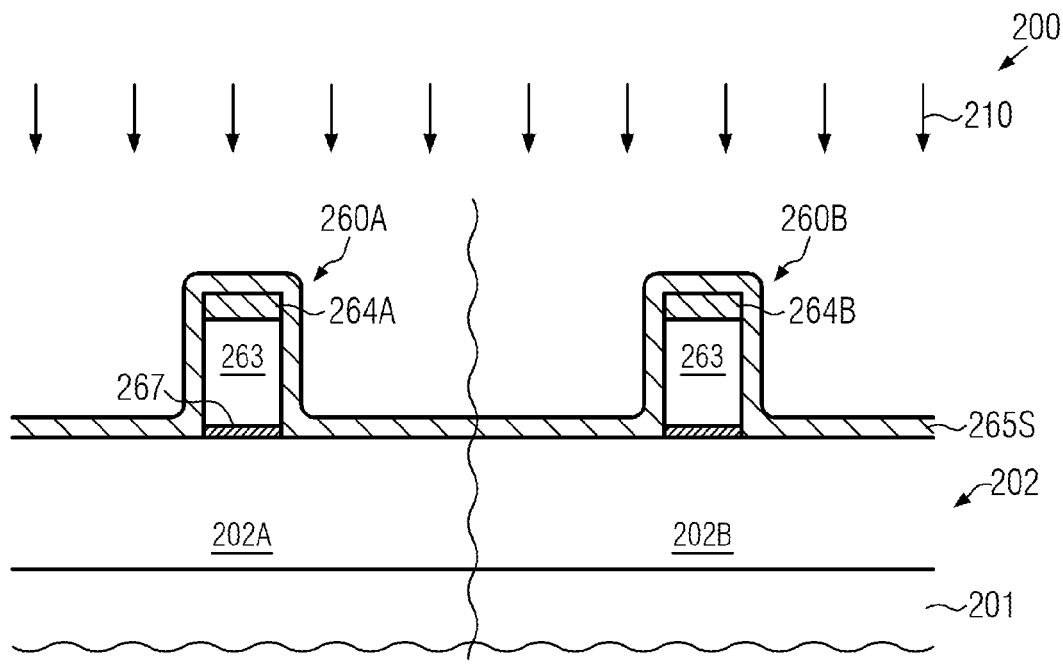

FIG. 2b schematically illustrates the semiconductor device 200 in a further advanced manufacturing stage. It should be appreciated that the gate electrode structures 260A, 260B in FIG. 2b are illustrated in the above-mentioned "conventional" configuration, that is, the gate dielectric material 267 may be provided in combination with the electrode material 263, wherein it should be appreciated, however, that the principles disclosed herein may be highly advantageously applied to the gate electrode structures as shown in FIG. 2a. Consequently, although the further description may be based on the gate electrode structures 260A, 260B as shown in FIG. 2b, in order to simplify the illustration in the drawings, it is to be appreciated that the active region 202A and the gate electrode structures 260A, 260B may have a configuration as shown in FIG. 2a.

Moreover, as illustrated, a spacer layer or layer system 265S may be formed so as to cover the active regions 202A, 202B and the gate electrode structures 260A, 260B. The spacer layer 265S may actually be comprised of two or more sub-layers, depending on the required degree of encapsulation. For example, as is also previously discussed above with reference to the semiconductor device 100, a protective liner (not shown) in combination with a spacer layer may be provided, for instance, in the form of silicon nitride materials that are deposited by multi\-layer deposition, low pressure CVD techniques and the like. Moreover, contrary to the conventional approach as discussed above, the device 200 may be exposed to a reactive etch atmosphere 210 in order to pattern the layer 265S into a sidewall spacer structure above the active region 202A and the active region 202B. Consequently, in this manner, the gate electrode structures 260A, 260B and the active regions 202A, 202B may "experience" the same process flow.

Figure 2C:
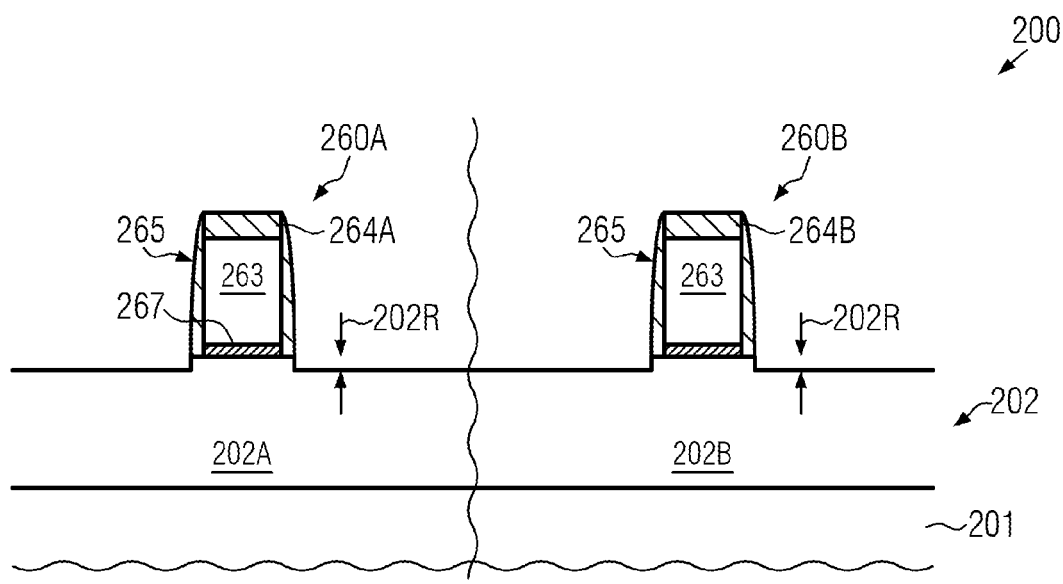

FIG. 2c schematically illustrates the semiconductor device 200 after the above-described process sequence. Hence, a sidewall spacer 265 or spacer structure may be formed on sidewalls of the gate electrode structures 260A, 260B and may thus represent a portion of the gate electrode structures so that the gate electrode structures 260A, 260B may have a very similar configuration, except for any differences upon providing sophisticated high-k dielectric materials in combination with work function adjusting species, as is also explained above with reference to the semiconductor device 100. Consequently, a substantially identical degree of recessing, indicated by 202R, may occur in the active regions 202A, 202B during the previous etch process for patterning the spacers 265. Moreover, the cap layers 264A, 264B may also have a similar thickness and condition in this manufacturing stage due to the similarity of the previously performed process flow.

Figure 2D:
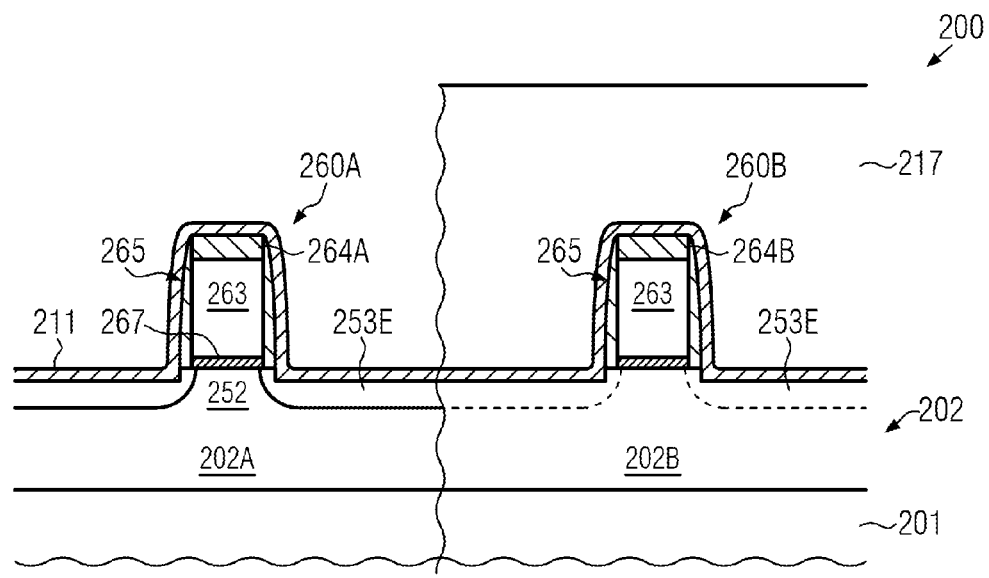

FIG. 2d schematically illustrates the semiconductor device 200 in a further advanced manufacturing stage according to some illustrative embodiments. As shown, an etch stop layer or liner 211, such as a silicon dioxide material and the like, may be formed in a highly conformal manner above the active regions 202A, 202B and the gate electrode structures 260A, 260B. Furthermore, in this manufacturing stage, in some illustrative embodiments, extension regions 253E, possibly in combination with any halo regions (not shown), may be formed in the active region 202A. In other embodiments, additionally, extension regions 253E in combination with halo regions (not shown) may also be provided in the active region 202B. To this end, appropriate masking regimes may be applied and implantation processes may be performed so as to incorporate the drain and source dopant species for the extension regions 253E and corresponding counter-doping species for any halo regions. For example, starting from the device configuration as shown in FIG. 2c, the extension regions 253E in the active region 202A may be formed by appropriately masking the active region 202B. Thereafter, the processing may be continued by an anneal process and forming the etch stop layer 211 in accordance with any appropriate process techniques, for instance by providing an undoped silicon dioxide material using well-established deposition recipes. In other cases, the layer 211 may be formed on the basis of deposition techniques for forming an undoped silicon dioxide material in combination with a silicon dioxide material comprising a certain amount of hydrogen species and the like, which may be accomplished by using specific plasma-based deposition recipes, which may generally provide superior gap fill capability if considered appropriate for further processing of the semiconductor device. It should be appreciated that the layer 211 may be provided with an appropriate thickness so as to act as an etch mask and a deposition mask during the further processing, wherein any material erosion may be determined in advance and may thus be taken into consideration when selecting an appropriate initial layer thickness.

In other illustrative embodiments, prior to forming the layer 211, the extension regions 253E and the corresponding halo regions may be formed in the active region 202B on the basis of any appropriate implantation and masking techniques. In some illustrative embodiments, the extension regions 253E in the second active region 202B may be formed prior to the extension regions 253E in the first active region 202A, which in turn may be formed on the basis of an implantation mask 217, such as a resist mask, which may also be used for patterning the layer 211. In this manner, any additional lithography steps may be avoided when patterning the layer 211. It should further be appreciated that the layer 211 may be formed prior to or after performing any implantation processes, depending on the thickness of the layer 211.

Figure 2E:
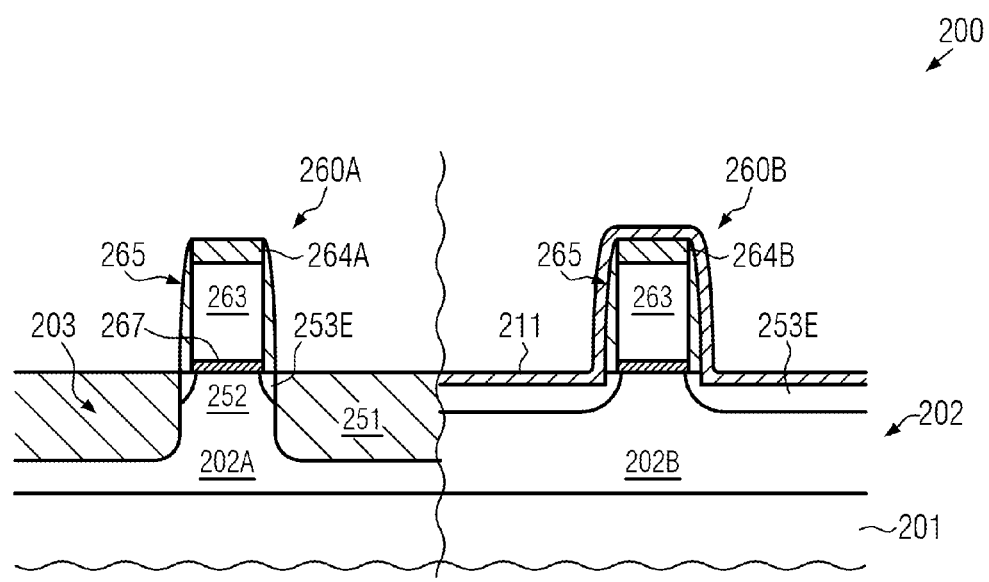

FIG. 2e schematically illustrates the semiconductor device 200 in a further advanced manufacturing stage. As shown, the second active region 202B and the gate electrode structure 260B may be covered by the etch stop or generally hard mask layer 211, while a strain-inducing semiconductor alloy 251 may be formed in the first active region 202A. To this end, the layer 211 may be patterned on the basis of the mask 217 of FIG. 2d, for instance by performing an appropriate wet chemical etch process and the like, followed by the removal of the mask 217. Next, an etch process may be applied so as to form cavities 203 in the active region 202A while using the cap layer 264A and the spacer 265 as an etch mask, while the gate electrode structure 260B and the active region 202B are protected by the layer 211, which may now act as an efficient etch stop material. Thereafter, any cleaning processes may be applied, which may also result in a certain degree of material erosion of the layer 211, wherein, however, the initial thickness may be appropriately selected so as to preserve a portion of the layer 211 during the subsequent selective deposition of a strain-inducing semiconductor material 251. Consequently, in this process, the layer 211 may act as a deposition mask. The material 251 may be provided as a strain-inducing semiconductor material, such as a silicon/germanium alloy, a silicon/tin alloy, a silicon/germanium/tin alloy, a silicon/carbon alloy and the like, depending on the type of strain to be induced in the channel region 252. In some illustrative embodiments, the material 251 may be provided so as to induce a compressive strain in the channel region 252 of the active region 202A. It should be appreciated that, in particular in the context of sophisticated high-k metal gate electrode structures, as shown in FIG. 2a, the material 251 may directly connect to the corresponding channel semiconductor material.

Figure 2F:
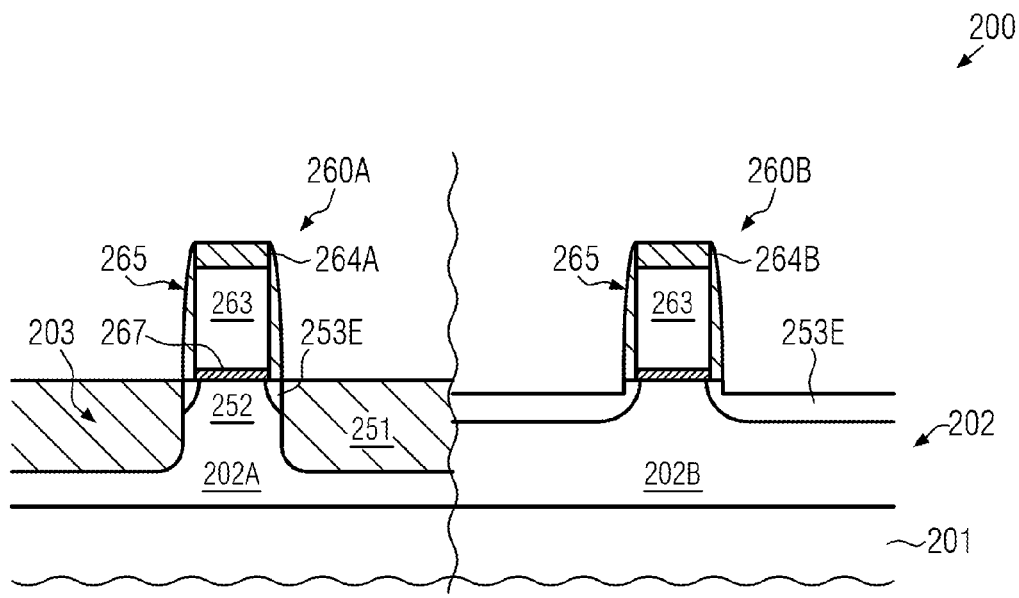

FIG. 2f schematically illustrates the semiconductor device 200 in a further advanced manufacturing stage according to some illustrative embodiments in which the layer 211 of FIG. 2e may be removed from above the second active region 202B, which may be accomplished by applying any well-established process techniques, such as wet chemical etch recipes and the like. Furthermore, in some illustrative embodiments, the drain and source extension regions 253E in the second active region 202B may be formed in this manufacturing stage by applying a corresponding masking regime and performing implantation processes, as is also discussed above. In other illustrative embodiments (not shown), the material 211 may be preserved so as to reduce the degree of exposure of the material 251 to reactive etch atmospheres.

Figure 2G:
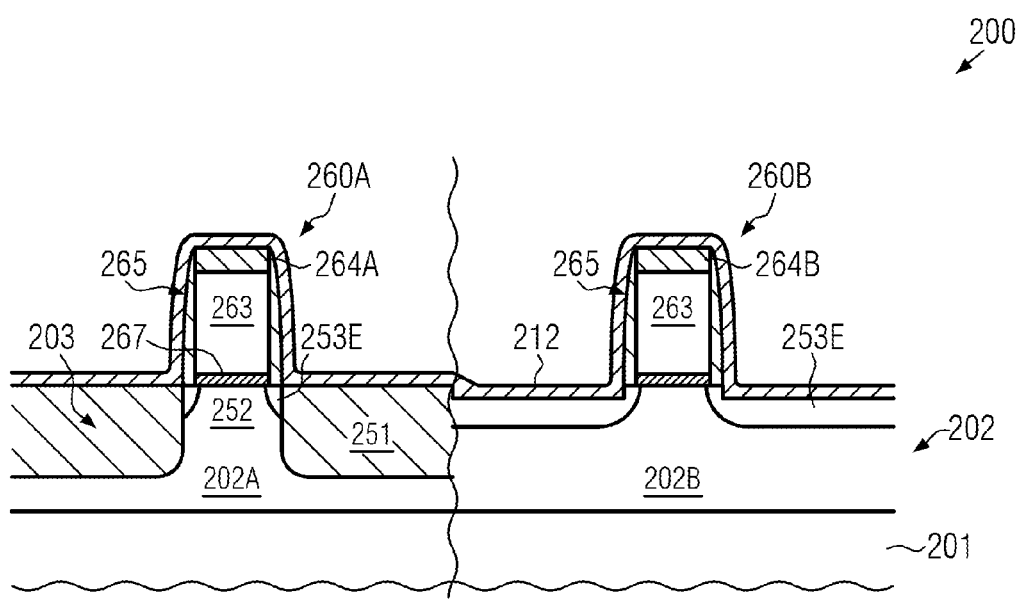

FIG. 2g schematically illustrates the semiconductor device 200 in a manufacturing stage in which a liner or etch stop layer 212 may be formed above the first and second active regions 202A, 202B, thereby confining the previously deposited strain-inducing semiconductor material 251. In some illustrative embodiments, the etch stop layer 212 may be provided in the form of a silicon dioxide-based material having an appropriate thickness so as to preserve integrity of, in particular, the material 251 during the further processing. To this end, any well-established deposition techniques may be applied, such as depositing an undoped silicon material, possibly in combination with a hydrogen-containing silicon dioxide material and the like. It should be appreciated that the deposition of the layer 212 may also result in the coverage of any critical areas in which exposure of sensitive material may have occurred during the previous processing. For example, the layer 212 may be provided with a thickness of 5-20 nm, while in other cases the thickness of the layer 212 may be selected so as to enable the patterning of a further sidewall spacer structure in a further advanced manufacturing stage. Consequently, the further processing may be continued without inducing additional material erosion in the active regions 202A, 202B and in particular in the strain-inducing material 251.

Figure 2H:
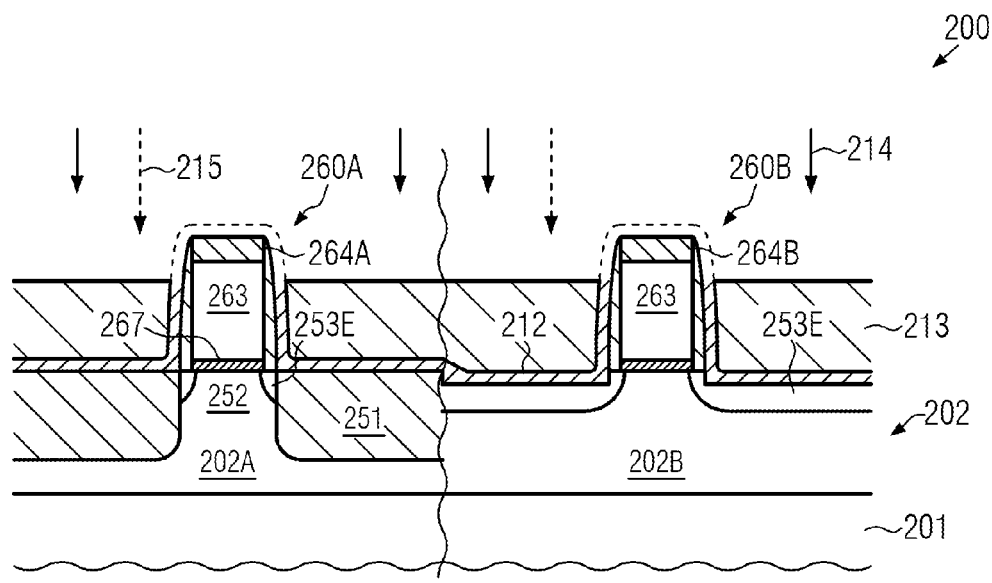

FIG. 2h schematically illustrates the semiconductor device 200 in a further advanced manufacturing stage. As shown, a sacrificial fill material 213, such as a resist material or any other type of polymer material, may be provided so as to laterally enclose a portion of the gate electrode structures 260A, 260B, while, however, exposing at least the top surface thereof. The material 213 may be provided on the basis of any appropriate deposition process, such as spin-on techniques and the like, followed by a material removal process in order to adjust the desired height of the material 213 in order to expose the layer 212 above the cap layers 264A, 264B. To this end, any appropriate wet chemical or plasma assisted etch process may be applied, wherein the adjustment of the height of the layer 213 is a substantially non-critical process step. Thereafter, the device 200 may be exposed to the reactive atmosphere of an etch process 214, in which an exposed portion of the layer 212 may be removed, as indicated by the dashed lines. To this end, well-established wet chemical recipes may be applied, for instance in the form of HF and the like, depending on the material composition of the layer 212. Thereafter, a further etch process 215 may be applied in order to remove the cap layers 264A, 264B, which have been exposed to the preceding etch process 214. Consequently, the cap layers 264A, 264B may be efficiently removed, for instance, on the basis of plasma assisted etch recipes or wet chemical etch processes, substantially without affecting the active regions 202A, 202B due to the presence of the material 213 and the etch stop layer 212. Thus, even if a certain difference in the thickness of the cap layers 264A, 264B may have been created during the previous cavity etch process, the process 215 may be applied with sufficient etch time so as to reliably remove the cap layers 264A, 264B without unduly affecting the active regions 202A, 202B. Thereafter, the sacrificial fill material 213, which may also be consumed to a certain degree during the processes 214 and 215, may be removed selectively with respect to the etch stop layer 212, thereby also preserving integrity of the active regions 202A, 202B.

In some illustrative embodiments, the layer 212, i.e., the remaining portion thereof, may be removed on the basis of appropriate etch techniques, such as wet chemical etch recipes and the like, which may have a high degree of selectivity with respect to the materials in the active regions 202A, 202B, so that a corresponding material erosion may be significantly less compared to the conventional process strategy.

In other illustrative embodiments (not shown), the layer 212 may be provided with a sufficient layer thickness so as to enable the patterning of a corresponding spacer structure from the layer 212 after the removal of the sacrificial material 213.

Figure 2I:
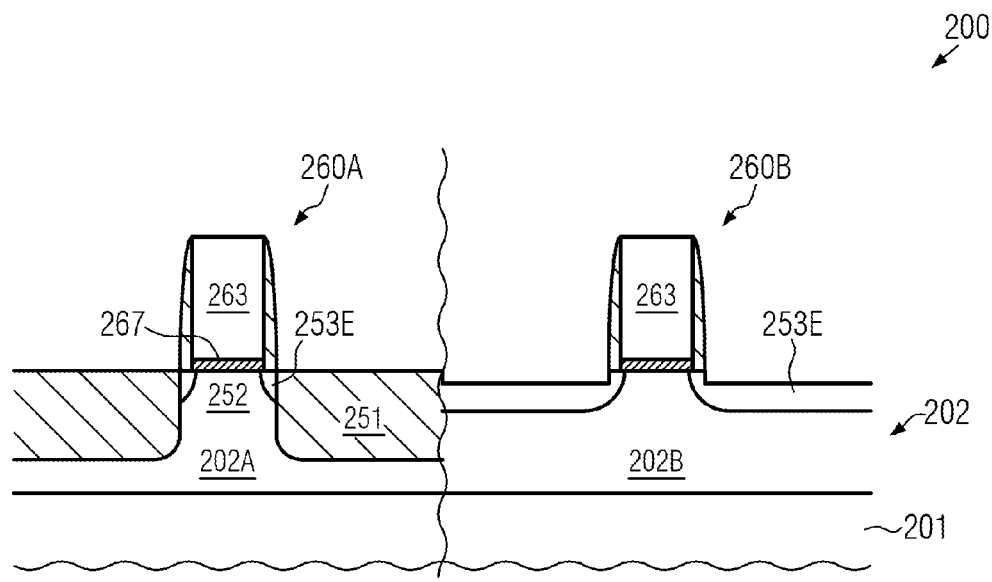

FIG. 2i schematically illustrates the semiconductor device 200 in a further advanced manufacturing stage according to illustrative embodiments in which the layer 212 of FIG. 2h may be removed on the basis of any appropriate process techniques. Consequently, the electrode material 263 of the gate electrode structures 260A, 260B may be exposed without causing a pronounced recessing in the active regions 202A, 202B. Consequently, the further processing may be continued on the basis of superior conditions with respect to overall surface topography and in particular with respect to the strain conditions in the active region 202A.

Figure 2J:
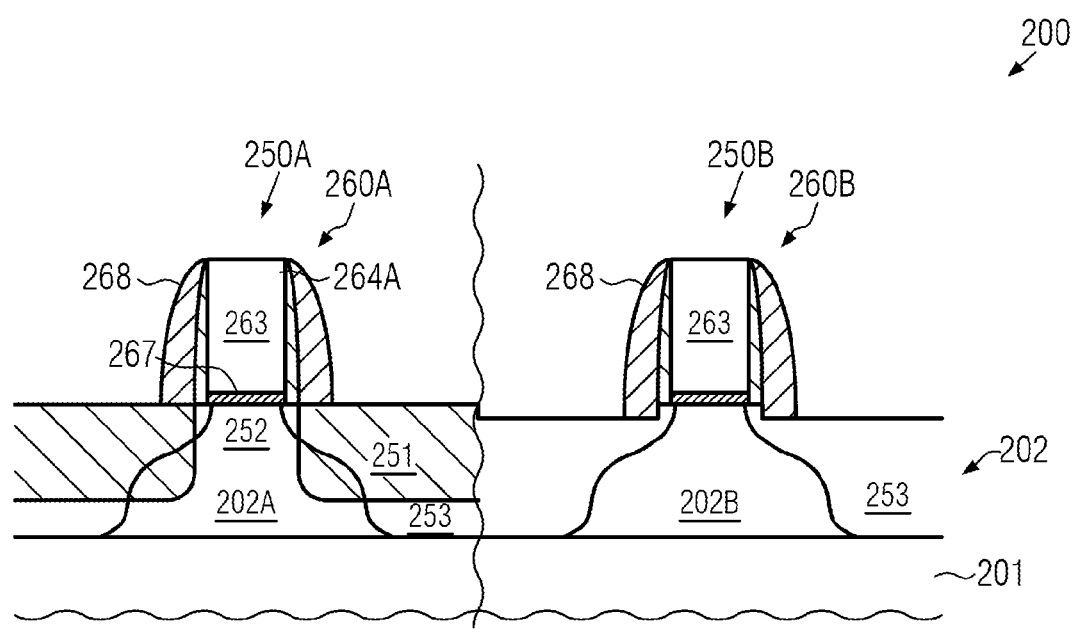

FIG. 2j schematically illustrates the semiconductor device 200 in a further advanced manufacturing stage. As illustrated, a spacer structure 268 may be provided in the gate electrode structures 260A, 260B and may be used to adjust a vertical and lateral dopant profile of drain and source regions 253, thereby obtaining the desired characteristics of a first transistor 250A formed in and above the first active region 202A, and of a second transistor 250B formed in and above the second active region 202B. To this end, any appropriate process strategies may be applied, for instance depositing a specific spacer layer or layer system and patterning the same using anisotropic etch techniques, followed by the incorporation of drain and source dopant species by using well-established masking regimes and implantation techniques.

Thereafter, an anneal process may be performed in order to adjust the final dopant profile of the drain and source regions 253. It should be appreciated that, if considered appropriate, the drain and source extension regions 253E, as shown in FIG. 2i, may be formed at a moderately late manufacturing stage, i.e., after the deposition of the strain-inducing semiconductor material and prior to forming the spacer structure 268.

In other illustrative embodiments, as also discussed above, the spacer structure 268 may be formed from the etch stop layer 212, which may be provided with a sufficient initial thickness in order to obtain the desired width of the spacer structure 268. For example, the layer 212 (FIG. 2g) may be provided in the form of a material layer system, such as a silicon nitride layer with a reduced thickness in combination with a silicon dioxide layer that complies with the requirement of the desired final spacer width. Thereafter, the resulting spacer layer system may be partially exposed on the basis of the sacrificial fill material 213 (FIG. 2h) and the further processing may be continued as is also described above with reference to FIG. 2h. Thereafter, instead of removing the spacer layer, as discussed above with reference to FIG. 2i, a corresponding patterning process may be applied so as to form the spacer structure 268 having the desired spacer width. To this end, well-established anisotropic etch techniques, for instance etching silicon dioxide selectively with respect to silicon nitride and the like, may be used. Thereafter, the dopant species may be incorporated, as described before. Based on the device configuration as shown in FIG. 2j, the further processing may be continued by preparing the device 200 for a silicidation process, if required, and thereafter the transistors 250A, 250B may be embedded in a dielectric material so as to passivate the transistors 250A, 250B prior to forming electrical contacts and a metallization system.

As a result, the present disclosure provides manufacturing techniques in which superior uniformity upon providing sophisticated gate electrode structures, such as high-k metal gate electrode structures, in combination with a strain-inducing material that is selectively provided in one type of transistor, may be accomplished by commonly patterning a protective liner or spacer structure for any type of transistor and by appropriately confining the strain-inducing semiconductor material after the selective deposition thereof by means of an appropriate etch stop liner, which may thus preserve integrity of the active regions during the further processing. Consequently, the degree of material loss of the strain-inducing semiconductor material may be significantly reduced and also the recessing of any type of active regions may be reduced, thereby contributing to superior device performance and reduced variability of transistor characteristics.

It should be appreciated that the gate electrode structures 260A, 260B may also be provided on the basis of a "conventional" configuration, that is, the dielectric material 267 may be provided with an appropriate thickness and in combination with the electrode material 263, possibly without requiring the channel semiconductor material 252A, if considered appropriate for the performance of the transistor still to be formed in and above the active regions 202A, 202B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   forming a first gate electrode structure above a first active region and a second gate electrode structure above a second active region, said first and second gate electrode structures comprising a dielectric cap layer;
   forming a protective spacer commonly on sidewalls of said first and second gate electrode structures;
   forming a strain-inducing semiconductor material in said first active region in the presence of said first gate electrode structure while covering said second active region and said second gate electrode structure;
   after forming said strain-inducing semiconductor material, forming drain and source extension regions in at least said second active region;
   forming an etch stop layer above said first and second active regions after forming said strain-inducing semiconductor material;
   forming a fill material above said first and second active regions so as to laterally enclose said first and second gate electrode structures and expose said dielectric cap layers;
   removing said dielectric cap layers; and
   forming drain and source regions in said first and second active regions.

2. The method of claim 1, wherein forming said first and second gate electrode structures comprises forming a high-k dielectric material in a gate insulation layer of said first and second gate electrode structures.

3. The method of claim 1, further comprising forming drain and source extension regions in said first active region prior to forming said strain-inducing semiconductor material.

4. The method of claim 1, further comprising forming drain and source extension regions in said second active region prior to forming said strain-inducing semiconductor material.

5. The method of claim 1, wherein forming said etch stop layer comprises forming a silicon dioxide material.

6. The method of claim 1, wherein forming said etch stop layer comprises forming a carbon material.

7. The method of claim 1, further comprising, after removing said dielectric cap layers, removing said fill material from above said first and second active regions and forming a second spacer structure from said etch stop layer adjacent to said sidewalls of said first and second gate electrode structures.

8. The method of claim 1, wherein forming said strain-inducing semiconductor material comprises forming a hard mask so as to expose said first active region and to cover said second active region.

9. The method of claim 8, wherein said hard mask layer is formed on the basis of silicon and oxygen.

10. The method of claim 8, further comprising removing said hard mask layer prior to forming said etch stop layer.

11. The method of claim 8, wherein said etch stop layer is formed above said hard mask layer.

12. A method of forming a semiconductor device, the method comprising:
   forming a strain-inducing semiconductor alloy in a first active region in the presence of a first gate electrode structure of a first transistor, while masking a second gate electrode structure and a second active region of a second transistor, each of said first and second gate electrode structures comprising a dielectric cap layer;

forming an etch stop layer above said first and second gate electrode structures and said first and second active regions;

forming a material layer above said etch stop layer;

removing said dielectric cap layers in the presence of at least a portion of said material layer; and after removing said dielectric cap layers, forming a spacer from said etch stop layer on sidewalls of said first and second gate electrode structures.

13. The method of claim 12, wherein said material layer is provided as a sacrificial fill material.

14. The method of claim 12, further comprising incorporating drain and source dopant species into said first and second active regions on the basis of said spacer.

15. The method of claim 12, wherein forming said first and second gate electrode structures comprises forming a protective spacer on sidewalls of an electrode material.

16. The method of claim 14, further comprising forming drain and source extension regions at least in said first active region prior to forming said strain-inducing semiconductor alloy.

17. The method of claim 15, further comprising forming a hard mask layer so as to mask said second active region and said second gate electrode structure.

18. The method of claim 17, further comprising forming cavities in said first active region in the presence of said hard mask.

19. A method, comprising:

forming a first gate electrode structure above a first active region of a first transistor, said first gate electrode structure comprising a first high-k dielectric material and a first dielectric cap layer;

forming a second gate electrode structure above a second active region of a second transistor, said first and second transistors being of inverse conductivity type, said second gate electrode structure comprising a second high-k dielectric material and a second dielectric cap layer;

forming a first spacer structure on sidewalls of said first and second gate electrode structures;

masking said second active region and said second gate electrode structure by a silicon dioxide-based material layer after forming said first spacer structure;

forming a cavity in said first active region by using said silicon dioxide-based material layer as an etch mask;

forming a strain-inducing semiconductor material in said cavity by using said silicon dioxide-based material layer as a deposition mask; and forming a sacrificial cap layer on said strain-inducing semiconductor material prior to removing said first and second dielectric cap layers.

20. A method of forming a semiconductor device, the method comprising:

forming a first gate electrode structure above a first active region and a second gate electrode structure above a second active region, said first and second gate electrode structures comprising a dielectric cap layer;

forming a protective spacer commonly on sidewalls of said first and second gate electrode structures;

forming a hard mask so as to expose said first active region and to cover said second active region;

forming a strain-inducing semiconductor material in said first active region in the presence of said first gate electrode structure while covering said second active region and said second gate electrode structure with said hard mask;

after forming said strain-inducing semiconductor material, forming an etch stop layer above said first active region and above said hard mask covering said second active region;

forming a fill material above said first and second active regions so as to laterally enclose said first and second gate electrode structures and expose said dielectric cap layers;

removing said dielectric cap layers; and forming drain and source regions in said first and second active regions.

* * * * *